(12) United States Patent
Zhang et al.

(10) Patent No.: US 10,317,932 B2
(45) Date of Patent: Jun. 11, 2019

(54) CAPACITIVE STRUCTURES FOR CROSSTALK REDUCTION

(71) Applicant: Intel Corporation, Santa Clara, CA (US)

(72) Inventors: Zhichao Zhang, Chandler, AZ (US); Xiang Li, Portland, OR (US); Kemal Aygun, Chandler, AZ (US); Zhiguo Qian, Chandler, AZ (US); Tolga Memioglu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 291 days.

(21) Appl. No.: 15/201,422

(22) Filed: Jul. 2, 2016

(65) Prior Publication Data

US 2018/0007782 A1    Jan. 4, 2018

(51) Int. Cl.
| | |
|---|---|
| *H05K 1/02* | (2006.01) |
| *G11C 5/06* | (2006.01) |
| *G06F 1/16* | (2006.01) |
| *G11C 5/04* | (2006.01) |
| *H05K 1/11* | (2006.01) |
| *H01R 13/6464* | (2011.01) |
| *H05K 1/14* | (2006.01) |
| *H05K 1/16* | (2006.01) |

(52) U.S. Cl.
CPC .................. *G06F 1/16* (2013.01); *G11C 5/04* (2013.01); *G11C 5/06* (2013.01); *G11C 5/063* (2013.01); *H01R 13/6464* (2013.01); *H05K 1/0231* (2013.01); *H05K 1/117* (2013.01); *H05K 1/141* (2013.01); *H05K 1/162* (2013.01); *H05K 2201/10159* (2013.01); *H05K 2201/10189* (2013.01)

(58) Field of Classification Search
CPC .......... H05K 1/0216; H05K 1/18; G11C 5/04; G11C 5/06; G06F 1/16; H01R 12/737
USPC .................................... 361/760, 785, 679.31
See application file for complete search history.

(56) References Cited

U.S. PATENT DOCUMENTS

| | | |
|---|---|---|
| 2005/0253662 A1 | 11/2005 | Seefried |
| 2008/0207059 A1 | 8/2008 | Shan et al. |
| 2012/0244752 A1* | 9/2012 | Patel .................. H01R 13/6466 439/620.22 |

(Continued)

FOREIGN PATENT DOCUMENTS

WO    2015-116043 A1    8/2015

OTHER PUBLICATIONS

International Search Report and Written Opinion issued in PCT Application No. PCT/US2017/035809, dated Sep. 12, 2017, 14 pages.

*Primary Examiner* — Rockshana D Chowdhury
(74) *Attorney, Agent, or Firm* — Grossman, Tucker, Perreault & Pfleger, PLLC

(57) ABSTRACT

One embodiment provides an apparatus. The apparatus includes a dual in-line memory module (DIMM). The DIMM includes at least one memory module integrated circuit (IC); a DIMM printed circuit board (PCB); a plurality of DIMM PCB contacts; and a capacitive structure. Each DIMM PCB contact is to couple the memory module IC to a respective DIMM connector pin. The capacitive structure is to provide a mutual capacitance between a first DIMM connector signal pin and a second DIMM connector signal pin.

14 Claims, 5 Drawing Sheets

(56) References Cited

U.S. PATENT DOCUMENTS

| | | | |
|---|---|---|---|
| 2014/0162498 A1* | 6/2014 | Enriquez-Shibayama | ................... H01R 12/737 439/629 |
| 2014/0174812 A1* | 6/2014 | Enriquez Shibayama | ................... H05K 9/00 174/350 |
| 2014/0179162 A1* | 6/2014 | Enriquez Shibayama | ................... H05K 1/0228 439/620.09 |
| 2014/0264907 A1 | 9/2014 | Altunyurt et al. | |
| 2015/0085458 A1* | 3/2015 | Enriquez Shibayama | ................... H01L 23/49822 361/774 |
| 2016/0094272 A1 | 3/2016 | Ye et al. | |
| 2017/0005438 A1* | 1/2017 | Benedict | .............. H01R 12/737 |

* cited by examiner

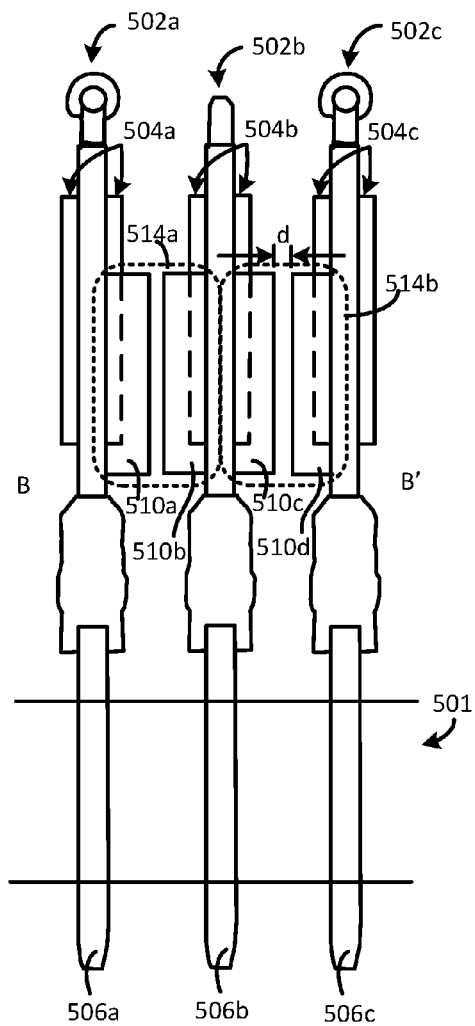
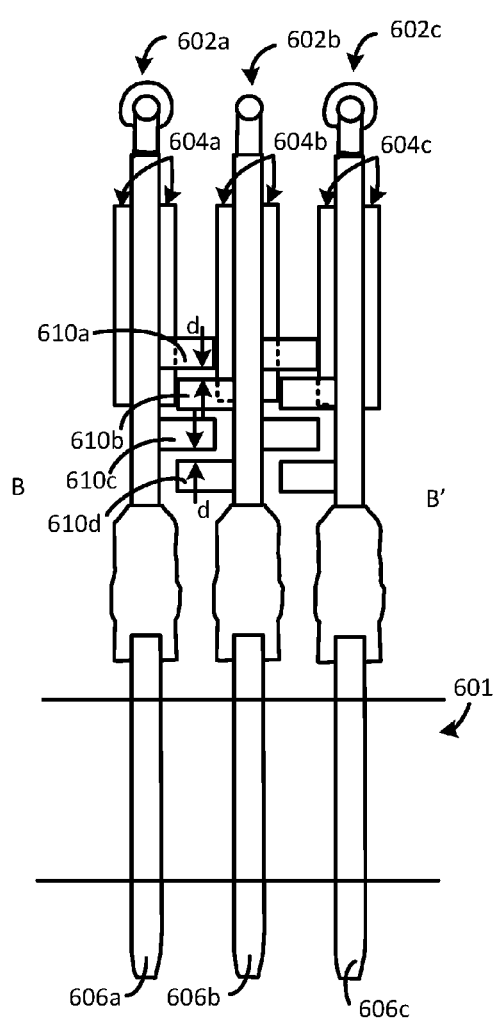
FIG. 5
FIG. 6

CAPACITIVE STRUCTURES FOR CROSSTALK REDUCTION

FIELD

The present disclosure relates to capacitive structures, in particular to, capacitive structures for crosstalk reduction.

BACKGROUND

In computing systems, a processor, one or more memory modules (e.g., dual inline memory modules (DIMMs)) and other circuitry may be coupled to a main system printed circuit board (PCB), i.e., "motherboard". The DIMMs may be removably inserted in associated DIMM electrical connectors that are mechanically fixed to the system PCB. Each DIMM may include a DIMM PCB that includes a plurality of electrical contacts, with each electrical contact configured to electrically couple to a corresponding pin included in the DIMM connector when the DIMM is inserted in the DIMM connector. The DIMM connector pins may be coupled to the processor via traces, plated through holes (PTHs) and vias included in the system PCB.

In order to reduce a surface area occupied by the DIMM connector and to maximize a number of pins included in the DIMM connector, the connector DIMM pins may be positioned relatively close together. As a result of the pin proximity, crosstalk may be produced between one or more adjacent signal pins in the DIMM connector. Far end crosstalk, produced at the DIMM connector, may be detected at a far end, e.g., at the processor, during memory read operations when the DIMM is transmitting.

BRIEF DESCRIPTION OF DRAWINGS

Features and advantages of the claimed subject matter will be apparent from the following detailed description of embodiments consistent therewith, which description should be considered with reference to the accompanying drawings, wherein:

FIG. 5 illustrates a sectional view of a DIMM connector portion and a plurality of DIMM PCB contacts, consistent with one embodiment of the present disclosure; and FIG. 6 illustrates a sectional view of another DIMM connector portion and plurality of DIMM PCB contacts, consistent with one embodiment of the present disclosure.

Figure 1:
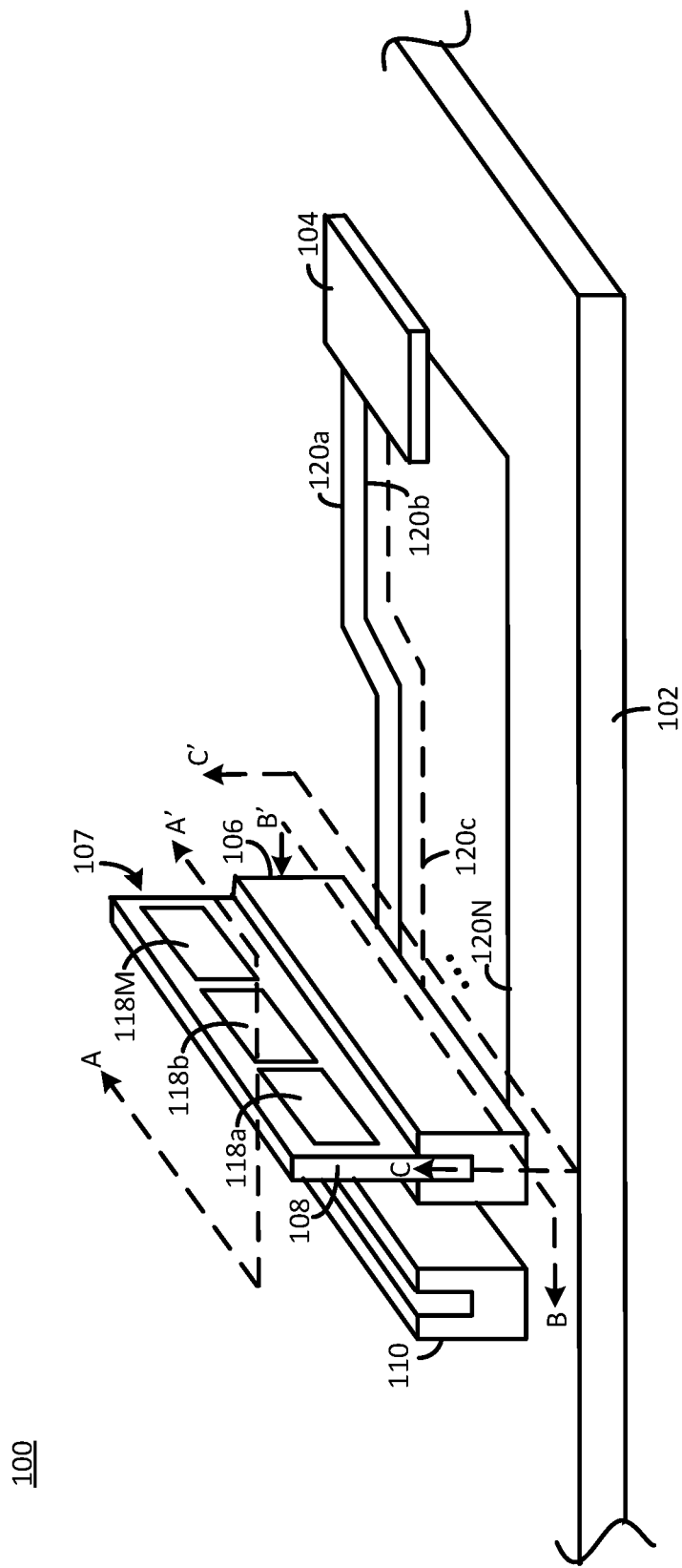
FIG. 1 illustrates a cross-section of an assembly consistent with several embodiments of the present disclosure.

Although the following Detailed Description will proceed with reference being made to illustrative embodiments, many alternatives, modifications, and variations thereof will be apparent to those skilled in the art.

DETAILED DESCRIPTION

The far end crosstalk may limit a data rate, e.g., a dual data rate (DDR) data rate, of an associated memory channel. An amount of crosstalk (i.e., interference) between two conductors is related to a proximity of the two conductors. A lesser amount of separation corresponds to a greater amount of crosstalk. For example, one or more other DIMM connector pins may be sufficiently close to a target DIMM connector pin such that far end crosstalk in the target signal path results from the proximity of the target DIMM connector pin to the other DIMM connector pins. Thus, one target DIMM connector pin may be susceptible to crosstalk produced by one or more other DIMM connector pins. An increase in pin separation may reduce the far end crosstalk at a cost of an increased footprint for the DIMM (dual inline memory module) connector. Far end crosstalk may also be reduced by including one or more ground pins between adjacent signal pins also at a cost of an increased footprint for the DIMM connector.

Generally, this disclosure relates to capacitive structures for crosstalk reduction. An apparatus, method and/or system are configured to provide, e.g., increase, a mutual capacitance between DDR memory channels in, at or near the DIMM connector. The provided mutual capacitance is configured to mitigate DIMM connector pin mutual inductance and, thus, to reduce far end crosstalk between the DDR memory channels. A capacitive structure that includes one or more features is configured to provide the mutual capacitance. At least a portion of the capacitive structure may be included in a mutual capacitor that has a capacitance value corresponding to the mutual capacitance.

In one embodiment, the mutual capacitance may be increased by including the capacitive structure within a DIMM PCB. In another embodiment, mutual capacitance may be increased by including a capacitive structure within the DIMM connector. In another embodiment, mutual capacitance may be increased by including a capacitive structure in or on a system PCB. In another embodiment, mutual capacitance may be increased by including a capacitive structure, e.g., discrete capacitors, coupled between DIMM connector pins in the DIMM connector and/or coupled between signal traces in the system PCB at or near the DIMM connector.

The mutual capacitance may be determined based, at least in part, on measured and/or modeled mutual inductance between signal channels. Thus, far end crosstalk ("FEXT"), detected at a processor, may be reduced. In one example, an allowable DDR data rate may be increased for a same pin configuration of a DIMM connector. In another example, an allowable DDR data rate may be maintained and one or more ground pins may be eliminated and/or a signal pin separation may be decreased and, thus a footprint of the DIMM connector may be decreased. Eliminating ground pins is configured to increase a ratio (i.e., S:G) of a number of signal pins to a number of ground pins.

Far end crosstalk may include a number of sources along a path from a transmitter (e.g., DIMM) to a receiver (e.g., processor). In other words, far end crosstalk is an accumulation of crosstalk contributions from the number of sources. Far end crosstalk may be modeled as:

$$FEXT = \int_0^d \frac{dV(l)}{dt} K_f(l) dl$$

where FEXT is far end crosstalk on a victim line or pin, V is voltage on an aggressor line or pin, t is time, l is distance from a source of the crosstalk, d is the total distance or length of the path from the transmitter to the receiver, and $K_f(l)$ is a crosstalk coefficient as a function of length. It may be appreciated that FEXT is related to frequency, thus, relatively higher frequencies may be associated with relatively more FEXT.

The crosstalk coefficient, $K_f(l)$, is related to transmission line geometry and to characteristics of a transmission line. Characteristics include signal path characteristics, self inductance, self capacitance, mutual inductance, and mutual capacitance. The crosstalk coefficient may be written as:

$$K_f(l) \propto \left(\frac{C_m}{C} - \frac{L_m}{L}\right) \begin{cases} = 0, \text{ stripline} \\ < 0, \text{ microstrip, via, connector} \end{cases}$$

where the symbol $\propto$ means "is proportional to", C is self-capacitance, $C_m$ is mutual capacitance, L is self-inductance and $L_m$ is mutual inductance. Self capacitance and self inductance are characteristics of a signal path, e.g., transmission line. For example, for signal traces, such as package or PCB traces, C and L may refer to per-unit-length parameters. In another example, for components such as connectors, C and L can refer to the values associated with the complete component (e.g., a connector pin pair).

Mutual capacitance corresponds to a capacitive (electrical) coupling between two conductors that allows a signal on a first conductor ("aggressor") to couple to a second conductor ("victim") causing interference. Mutual inductance corresponds to a magnetic coupling between two conductors that similarly allows interference. It may be appreciated that the far end crosstalk produced at a DIMM connector has a crosstalk coefficient that is generally inductive.

In an embodiment consistent with the present disclosure, a mutual capacitance may be provided, i.e., increased, by including a capacitive structure positioned relative to a target (i.e., "victim") DIMM connector pin and/or relative to an "aggressor" DIMM connector pin. The provided mutual capacitance is configured to offset the mutual inductance between the target DIMM connector pin and the aggressor DIMM connector pin to reduce the magnitude of the crosstalk coefficient. Reducing the magnitude of the crosstalk coefficient is configured to reduce the far end crosstalk that may be experienced, e.g., by a processor during a memory read operation.

The mutual capacitance provided by one or more capacitive structures to a target DIMM connector pin may be determined as:

$$C_m = \sum_{i=1}^N C_{mi} = \sum_{i=1}^N \frac{\varepsilon_0 \varepsilon_{ri} A_i}{d_i}$$

where $C_m$ is total mutual capacitance provided to the target DIMM connector pin. $C_{mi}$ is a component mutual capacitance related to at least one feature of a capacitive structure. i is an index corresponding to the component mutual capacitance provided by at least a portion of a capacitive structure. N is a number of contributors (i.e., components) to the mutual capacitance for the target DIMM connector pin. $\varepsilon_0$ is permittivity of free space. $\varepsilon_{ri}$ is relative permittivity of a dielectric region for each component mutual capacitance. $A_i$ is an area that conductive features, e.g., plates, overlap for each component mutual capacitance. $d_i$ is separation between the overlapping conductive features, i.e., a thickness of the dielectric region. Each dielectric region may include a dielectric material. Dielectric materials may include, but are not limited to, liquid crystal polymer (LCP), glass fiber epoxy laminate (e.g., fire retardant FR4), polyimide film (e.g., Kapton®), glass microfiber reinforced PTFE (polytetrafluoroethylene) (e.g., Rogers RT/Duroid® 5870/5880 high frequency laminate) and/or combinations thereof.

Thus, a mutual capacitance that includes at least one component mutual capacitance may be provided by at least one capacitive structure, as described herein. A plurality of component mutual capacitances may be combined to provide a total mutual capacitance for a target DIMM connector pin. The component mutual capacitances may be related to a single other DIMM connector pin or may be related to a plurality of other DIMM connector pins. A capacitive structure may be configured to include one or more conductive features. A capacitive structure may be further configured to provide one or more component mutual capacitances. Each component mutual capacitance may correspond to a mutual capacitor.

Reducing a source of far end crosstalk may improve performance and increase a DDR data rate (i.e., increase a DDR speed bin) of an associated communication channel for a same pin count and footprint. Improved far end crosstalk using a capacitive structure may allow eliminating at least some ground pins, thus reducing a DIMM connector pin count, footprint and/or cost. A reduced DIMM connector footprint may facilitate increasing a maximum number of DIMMs, and thus memory capacity, that may be accommodated on a system PCB. Reducing a source of far end crosstalk may facilitate relaxing routing design rules while maintaining performance. The capacitive structure(s), as described herein, are configured to have minimal, if any, impact on design and manufacturing complexity.

In the following, capacitive structures for crosstalk reduction are described with respect to DIMMs, DIMM connectors and associated memory channels. It may be appreciated that capacitive structures for crosstalk reduction may be similarly implemented for other electrical connectors, other single-ended communication channels and/or differential communication channels, within the scope of this disclosure.

FIG. 1 illustrates a cross-section of an assembly 100 consistent with several embodiments of the present disclosure. Assembly 100 includes a system printed circuit board (PCB) 102, a processor 104, a DIMM connector 106 coupled to a DIMM 107 and an unloaded DIMM connector 110. For example, system PCB 102 may correspond to a "motherboard". The DIMM 107 includes a DIMM PCB 108 and a plurality of memory module integrated circuits (ICs) 118a, 118b, . . . , 118M. For example, the memory module ICs may include double data rate (DDR) memory module ICs. The plurality of memory module ICs 118a, . . . , 118M are coupled to the DIMM PCB 108. The DIMM 107 is inserted in DIMM connector 106 and may be coupled to the processor 104 via DIMM connector 106 and a plurality of conductive traces 120a, 120b, 120c, . . . , 120N that are included in system PCB 102. FIG. 1 is simplified for ease of illustration and ease of description. For example, system PCB 102 may include one or more other circuit elements and/or circuitry not explicitly shown in FIG. 1.

Crosstalk produced at DIMM connector 106, for example during a memory read operation of memory module ICs 118a, ..., 118M, may be transmitted to processor 104 via one or more of traces 120a, ..., 120N. The crosstalk may be mitigated by one or more capacitive structures configured to provide a mutual capacitance to a target DIMM connector pin, as described herein.

Figure 2:
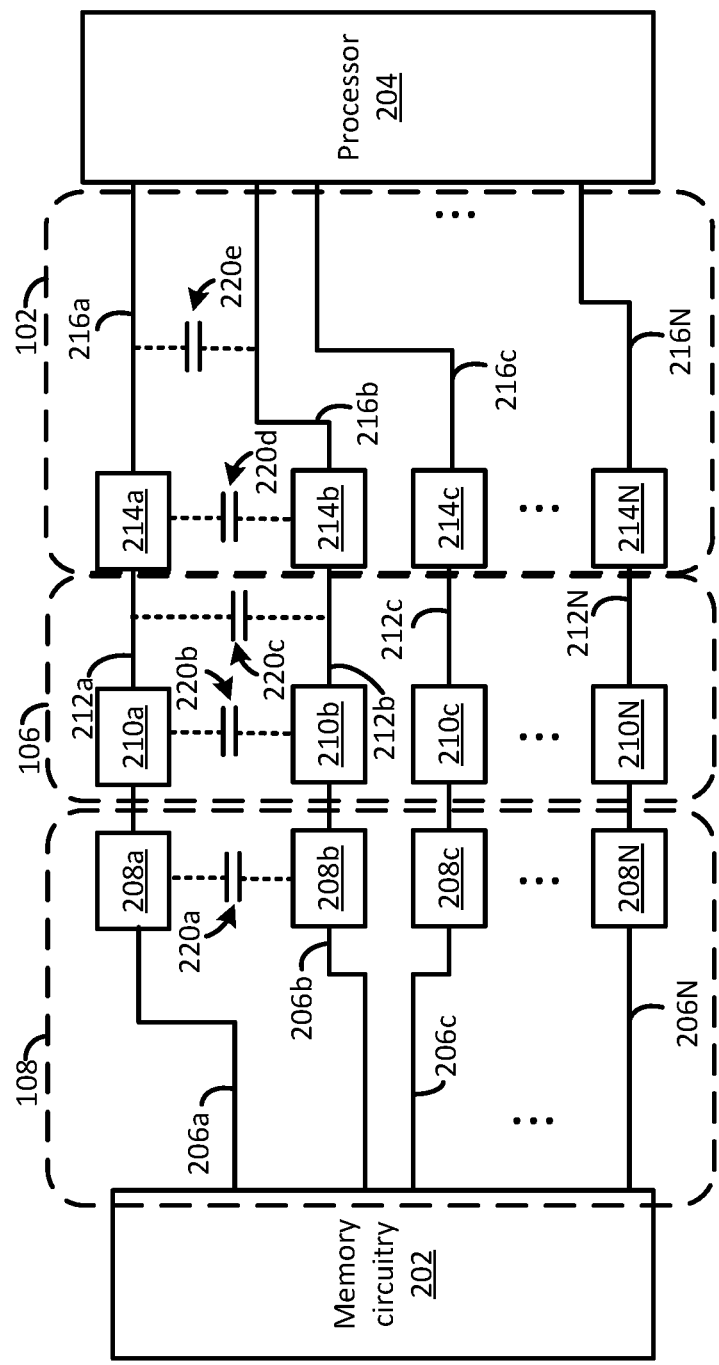
FIG. 2 is a sketch illustrating electrical connections between memory circuitry and a processor consistent with several embodiments of the present disclosure.

FIG. 2 is a sketch 200 illustrating electrical connections between memory circuitry 202 and a processor 204, consistent with several embodiments of the present disclosure. For example, memory circuitry 202 may correspond to a memory module IC, e.g., memory module IC 118a, and processor 204 may correspond to processor 104 of FIG. 1. Memory circuitry 202 may be electrically coupled to processor 204 by a plurality of contacts, pins and conductive traces. The contacts, pins and/or conductive traces may include a conductive material including, but not limited to, metal and/or metal composites, e.g., copper, aluminum, silver palladium (AgPd), gold palladium (AuPd), etc. At least some of the electrical contacts, pins and/or conductive traces may be capacitively coupled to a target DIMM connector pin by a capacitive structure configured to provide a mutual capacitance between the target DIMM connector pin and another DIMM connector pin.

Memory circuitry 202 is coupled to a plurality of DIMM PCB contacts 208a, 208b, 208c, ..., 208N by a plurality of DIMM PCB traces 206a, 206b, 206c, ... 206N. The DIMM PCB contacts 208a, 208b, 208c, ..., 208N and DIMM PCB traces 206a, 206b, 206c, ... 206N may be included in, for example, DIMM PCB 108 of FIG. 1. Each of the DIMM PCB contacts 208a, 208b, 208c, ..., 208N may be further coupled to respective DIMM connector contacts, i.e., respective DIMM connector pins 210a, 210b, 210c, ..., 210N. The DIMM connector pins 210a, 210b, 210c, ..., 210N may be included in, for example, DIMM connector 106. The DIMM connector pins 210a, 210b, 210c, ..., 210N may be configured to couple to the DIMM PCB contacts 208a, 208b, 208c, ..., 208N when a DIMM, e.g., DIMM 107, is inserted in a DIMM connector, e.g., DIMM connector 106.

Each of the DIMM connector pins 210a, 210b, 210c, ..., 210N is coupled to respective DIMM connector to system PCB pins 212a, 212b, 212c, ..., 212N that may be coupled to respective system PCB contacts 214a, 214b, 214c, ..., 214N. For example, the system PCB contacts 214a, 214b, 214c, ..., 214N may be plated through holes (PTHs) included in, e.g., system PCB 102. Each of the system PCB contacts 214a, 214b, 214c, ..., 214N may then be coupled to processor 202 by respective system PCB traces 216a, 216b, 216c, ..., 216N. Thus, memory circuitry 202 may be coupled to processor 204 by a plurality of contacts, pins and conductive traces.

Thus, DIMM PCB traces 206a, 206b, 206c, ... 206N and DIMM PCB contacts 208a, 208b, 208c, ..., 208N may be included in DIMM PCB 108. DIMM connector pins 210a, 210b, 210c, ..., 210N and DIMM connector to system PCB pins 212a, 212b, 212c, ..., 212N may be included in DIMM connector 106. System PCB contacts 214a, 214b, 214c, ..., 214N and system PCB traces 216a, 216b, 216c, ..., 216N may be included in system PCB 102.

Sketch 200 may further include one or more mutual capacitors 220a, 220b, 220c, 220d and/or 220e configured to mitigate far end crosstalk, as described herein. The mutual capacitors may be configured as parallel plate capacitors having a first plate and a second plate separated by a dielectric material. A capacitance of each mutual capacitor 220a, 220b, 220c, 220d, 220e may correspond to a respective mutual capacitance provided by a capacitive structure, as described herein. In one embodiment, one mutual capacitor may be coupled to a target DIMM connector pin, directly or through other conductive circuitry. In another embodiment, a plurality of mutual capacitors may be coupled to the target DIMM connector pin, directly or through other conductive circuitry.

In one example, mutual capacitor 220a may be included in a DIMM PCB, e.g., DIMM PCB 108, coupled between two DIMM PCB contacts, e.g., DIMM PCB contacts 208a, 208b. In this example, mutual capacitor 220a may correspond to a parallel plate capacitor that includes a first plate and a second plate. At least a portion of one DIMM PCB contact, e.g., DIMM PCB contact 208a, may correspond to the first plate. The second plate may be included in the DIMM PCB 108 and coupled to DIMM PCB contact 208b by a conductive trace and a via, as described herein. In this example, the second DIMM PCB contact 208b corresponds to a target DIMM PCB contact and the first DIMM PCB contact 208a corresponds to one other (i.e., aggressor) DIMM PCB contact, as described herein. The DIMM PCB contacts may or may not be adjacent on the DIMM PCB. For example, non-adjacent DIMM PCB contacts may be separated by at least one DIMM PCB ground contact.

In another example, mutual capacitor 220b may be included in a DIMM connector, e.g., DIMM connector 106, coupled between two DIMM connector contacts, e.g., DIMM connector pins 210a, 210b. Mutual capacitor 220b may correspond to a capacitive structure that includes a plurality of conductive features configured as one or more parallel plate capacitors. Thus, each plate may correspond to a conductive feature, as described herein. For each parallel plate capacitor, a first plate may be coupled to a first DIMM connector contact, e.g., DIMM connector pin 210a, and a second plate may be coupled to a second DIMM connector contact, e.g., DIMM connector pin 210b. For example, the first plate and the second plate may be included in a DIMM connector housing. The first plate and the second plate are configured to overlap. An overlap region may contain a dielectric material, thus forming the parallel plate capacitor 220b. A plane associated with each plate may be generally parallel to a long axis of a DIMM connector pin or may be generally perpendicular to the long axis of the DIMM connector pin, as described herein.

In another example, mutual capacitor 220c may be coupled between two DIMM connector to system PCB pins, e.g., DIMM connector to system PCB pins 212a, 212b. Mutual capacitor 220c may correspond to a capacitive structure that is configured as a parallel plate capacitor. In one embodiment, a first plate of the mutual capacitor 220c may be coupled to a first DIMM connector to system PCB pin, e.g., DIMM connector to system PCB pin 212a, and a second plate may be coupled to a second DIMM connector to system PCB pin, e.g., DIMM connector to system PCB pin 212b. In this example, the mutual capacitor 220c may be included in the DIMM connector housing.

In another example, mutual capacitor 220d may be coupled between two system PCB contacts, e.g., system PCB contacts 214a, 214b. Mutual capacitor 220d may correspond to a capacitive structure that is configured as a parallel plate capacitor. A first plate of the mutual capacitor 220d may be coupled to a first system PCB contact, e.g., system PCB contact 214a, and a second plate of the mutual capacitor 220d, to a second system PCB contact, e.g., system PCB contact 214b. In this example, the mutual capacitor 220d may be included in a system PCB, e.g., system PCB 102.

In another example, mutual capacitor 220e may be coupled between two system PCB traces, e.g., system PCB trace 216a and system PCB trace 216b. In this example, mutual capacitor 220e may correspond to a capacitive structure that includes a plurality of conductive features constructed in a plurality of layers of the system PCB. Additionally or alternatively, mutual capacitor 220e may be implemented as a discrete component coupled between two system PCB traces. Mutual capacitor 220e may be positioned at or near the DIMM connector, e.g., DIMM connector 106, that includes memory circuitry 202. An effect of the mutual capacitance on far end crosstalk may be relatively greater the closer the mutual capacitance is positioned relative to the source, i.e., memory circuitry 202.

Thus, one or more capacitive structures configured to provide a corresponding mutual capacitance may be included in or on a DIMM PCB, a DIMM connector and/or a system PCB. A mutual capacitor that includes at least a portion of capacitive structure may have an associated capacitance value that corresponds to a target mutual capacitance. The mutual capacitors and associated mutual capacitances are configured to reduce a far end crosstalk detected at a processor and associated with memory read operations of a DIMM, as described herein.

Figure 3A:
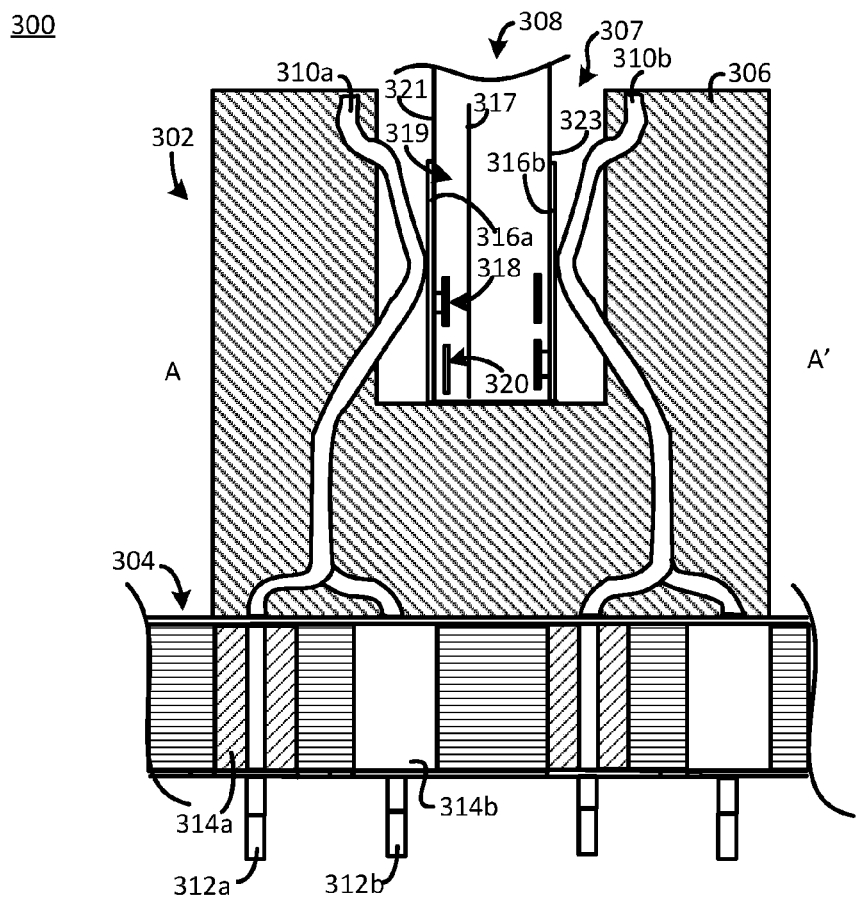
FIG. 3A illustrates a sectional view of a dual in-line memory module (DIMM) connector consistent with one embodiment of the present disclosure.

FIG. 3A illustrates a sectional view 300 of a dual in-line memory module (DIMM) connector consistent with one embodiment of the present disclosure. Sectional view 300 corresponds to section A-A' of FIG. 1. Sectional view 300 may thus correspond to a cross-section of DIMM connector 106 and DIMM PCB 108. Memory module ICs are omitted from sectional view 300. Sectional view 300 includes a DIMM connector 302, a system PCB 304 and a DIMM PCB portion 308. The DIMM PCB portion 308 is inserted into a slot 307 of DIMM connector 302. Thus, DIMM connector 302 may correspond to DIMM connector 106, system PCB 304 may correspond to system PCB 102 and the DIMM PCB portion 308 may correspond to a portion of the DIMM PCB 108 of FIG. 1.

DIMM connector 302 includes a plurality of DIMM connector contacts, e.g., DIMM connector pins 310a, 310b, and a plurality of DIMM connector to system PCB pins, e.g., system PCB pins 312a, 312b. System PCB 304 includes a plurality of system PCB contacts, e.g., system PCB contacts 314a, 314b, configured to receive DIMM connector to system PCB pins 312a, 312b when DIMM connector 302 is mounted on system PCB 304. For example, DIMM connector pins 310a, 310b may be signal pins. For example, system PCB contacts 314a, 314b may be plated through holes (PTHs).

DIMM PCB portion 308 includes a plurality DIMM PCB contacts, e.g., DIMM PCB contacts 316a, 316b. The DIMM PCB contacts 316a, 316b are positioned on opposing surfaces 321, 323 of DIMM PCB portion 308. DIMM PCB contacts 316a, 316b are configured to contact respective DIMM connector pins 310a, 310b when DIMM PCB 308 is inserted in slot 307. DIMM PCB portion 308 may further include a ground plane 317. The ground plane 317 is positioned a distance from a first surface 321 of DIMM PCB portion 308. The ground plane 317 and first surface 321 may define a ground plane recess 319. Thus, at least a portion of the ground plane recess 319 may be positioned between a DIMM PCB contact, e.g., DIMM PCB contact 316a, and the ground plane 317. The ground plane recess 319 may accommodate at least a portion of a capacitive structure configured to provide a mutual capacitance between two DIMM connector signal pins, as described herein.

DIMM PCB portion 308 may include a first feature 318 and a second feature 320 related to providing a mutual capacitance between, e.g., DIMM connector pin 310a, and one or more other DIMM connector pins. For example, the first feature 318 may correspond to a via configured to couple DIMM PCB contact 316a to a trace included in an inner layer (e.g., in the ground plane recess 319) of DIMM PCB portion 308. In another example, the second feature 320 may correspond to one plate of a parallel plate capacitor and may be separated from DIMM PCB contact 316a by a dielectric material. At least a portion of DIMM PCB contact 316a may correspond to a second plate of the parallel plate capacitor, in this example.

Thus, the first feature 318 may be included in a first capacitive structure and the second feature 320 may be included in a second capacitive structure. The features 318, 320 may be positioned in a ground plane recess 319, e.g., ground plane recess 319, that is adjacent one or more DIMM PCB contacts, e.g., DIMM PCB contact 316a. Positioning the capacitive structures in the ground recess 319 is configured to minimize an effect of the capacitive structures on return and/or insertion losses. Positioning the capacitive structures in the ground recess 319 may be further configured to constrain an effect of the capacitive structures on near end crosstalk.

Figure 3B:
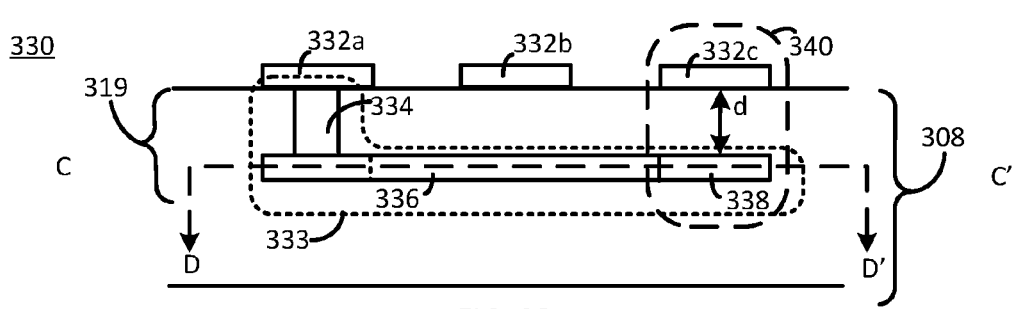
FIG. 3B illustrates a sectional view of a DIMM printed circuit board (PCB), consistent with one embodiment of the present disclosure.

FIG. 3B illustrates a sectional view 330 of a DIMM printed circuit board (PCB), consistent with one embodiment of the present disclosure. Sectional view 330 corresponds to section C-C' of FIG. 1. Sectional view 330 includes the ground plane recess 319, a plurality of DIMM PCB contacts 332a, 332b, 332c and a capacitive structure 333. Capacitive structure 333 is configured to provide a mutual capacitance when the capacitive structure 333 is included in a DIMM PCB. For example, the capacitive structure 333 may be included in the ground plane recess of, e.g., DIMM PCB 308. The capacitive structure 333 includes a via 334, a conductive trace 336 and a plate 338. The via 334 is coupled to the conductive trace 336 and the trace is coupled to the plate 338. The via 334 may be a buried via or may be a through via. The type of via selected may be related to cost and/or ease of manufacturing. The via 334 is further coupled to a first DIMM PCB contact 332a. Thus, the first DIMM PCB contact 332a may be coupled to plate 338 by via 334 and conductive trace 336. A second DIMM PCB contact 332b may be coupled to, e.g., ground. Conductive trace 336 is configured to span the second DIMM PCB contact 332b.

Plate 338 may be positioned the distance, d, from a third DIMM PCB contact 332c. A region between plate 338 and the third DIMM PCB contact 332c may contain a dielectric material. Thus, plate 338, the dielectric and at least a portion of the third DIMM PCB contact 332c may correspond to a parallel plate capacitor 340. Parallel plate capacitor 340 is one example of mutual capacitor 220a of FIG. 2. For example, a signal associated with a read operation transmitted from a DIMM via the first DIMM PCB contact 332a may be susceptible to far end crosstalk due to mutual inductance between respective DIMM connector pins coupled to DIMM PCB contacts 332a and 332c. The mutual capacitance provided by mutual capacitor 340 is configured to mitigate the effects of the mutual inductance and to thus reduce the far end crosstalk associated with the read operation.

Figure 3C:
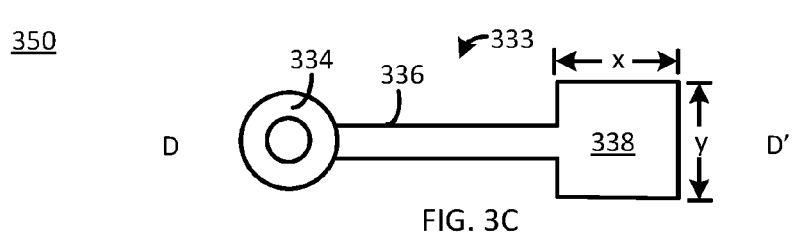
FIG. 3C illustrates a sectional view of the DIMM PCB of FIG. 3B, consistent with one embodiment of the present disclosure.

FIG. 3C illustrates a sectional view 350 of the DIMM PCB 308 of FIG. 3B, consistent with one embodiment of the present disclosure. FIG. 3C may be best understood when considered in combination with FIG. 3B. Sectional view 350 corresponds to section D-D' of FIG. 3B. Sectional view 350 is configured to illustrate features of the capacitive structure 333 configured to provide mutual capacitance when the capacitive structure 333 is included in a DIMM PCB, e.g., DIMM PCB 108 of FIG. 1. Capacitive structure 333 includes via 334 coupled to conductive trace 336 coupled to plate 338. A capacitance, i.e., mutual capacitance, of mutual capacitor 340 is related to an area, A, of plate 338. In this embodiment, the plate 338 is generally square. In other embodiments, the plate 338 may be rectangular, generally circular, ellipsoidal, etc. In this embodiment, the area A corresponds to a width, x, of plate 338 multiplied by a length, y, of plate 338. The area, A, corresponds to an area of overlap between plate 338 and DIMM PCB contact 332c. The area, A, may be determined based, at least in part, on a target mutual capacitance. For example, the target mutual capacitance may be determined through measurement and/or modeling based, at least in part, on electrical and/or mechanical characteristics of a corresponding DIMM connector.

The mutual capacitance of mutual capacitor 340 is further dependent on plate separation, d, and permittivity of the dielectric material in the region between plate 338 and DIMM PCB contact 332c. For example, a size of the area, A, may be in the range of 100 um$^2$ (micrometers$^2$) to 1 mm$^2$ (millimeters$^2$), the plate separation, d, may be in the range of 5 um to 200 um, and the relative permittivity may be in the range of 2 to 6. The plate separation may be constrained by characteristics of DIMM PCB 308, e.g., layer height, layer separation, trace thickness, a dimension of the ground recess 319, etc. Similarly, the permittivity of the dielectric material may be constrained by characteristics of DIMM PCB 308, e.g., PCB material selection. Thus, a range of values of a target mutual capacitance may be relatively more easily adjusted by changing a size of the area, A, e.g., changing dimensions x and/or y. For example, a target value for mutual capacitance may be on the order of one picofarad (pF). In another example, a target value for the mutual capacitance may be greater than 1 pF or less than 1 pF.

Thus, a capacitive structure configured to provide a mutual capacitance may be included in a DIMM PCB. The mutual capacitance is configured to mitigate far end crosstalk that may be produced by DIMM connector pins. The mutual capacitor may be implemented by coupling a plate to a first DIMM PCB contact using a via and a trace and positioning the plate relative to a second DIMM PCB contact. The first DIMM PCB contact may be associated with a "victim" and the second DIMM PCB contact may be associated with an "aggressor". The plate may then correspond to a first plate of a parallel plate capacitor, i.e., the mutual capacitor, and at least a portion of the second DIMM PCB contact may correspond to a second plate of the mutual capacitor. A target mutual capacitance value may be achieved by adjusting a size of the first plate of the parallel plate capacitor and/or an amount of overlap of the plate and the DIMM PCB contact portion.

Figure 4:
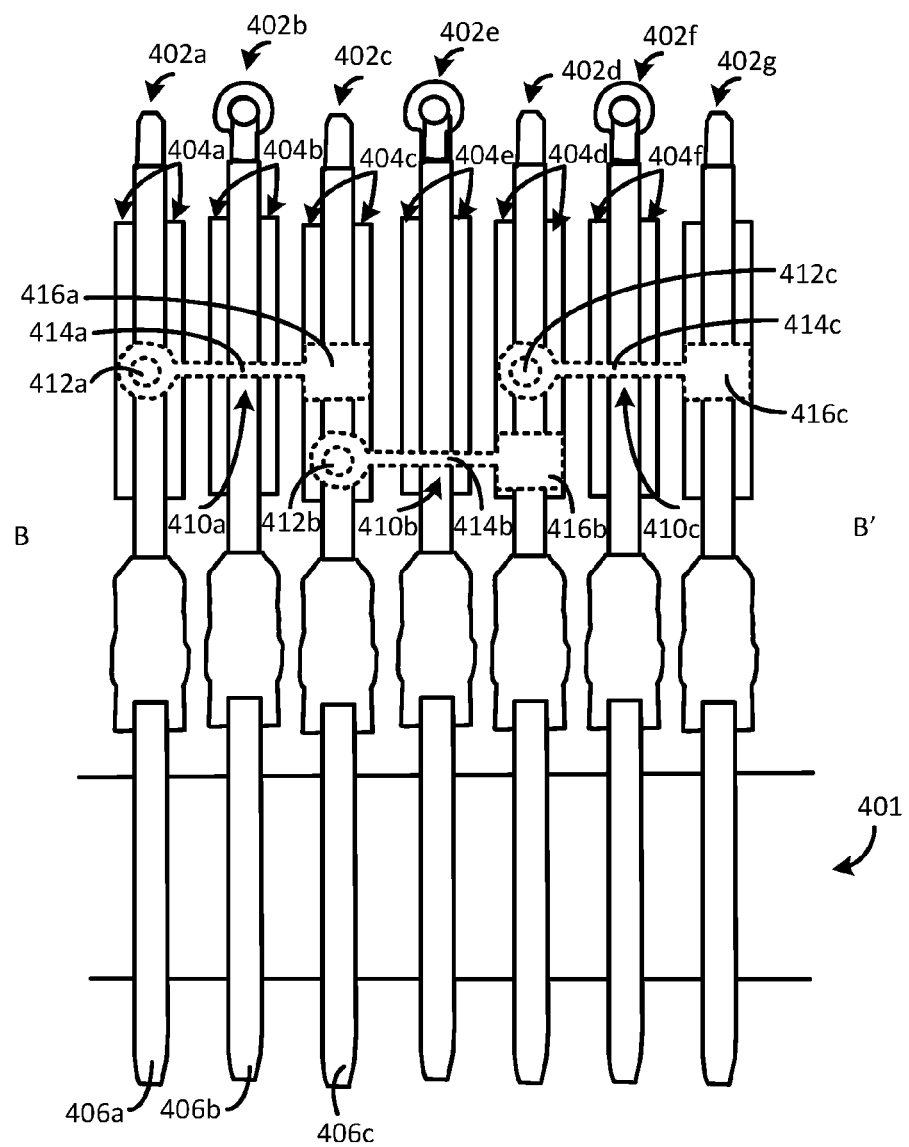
FIG. 4 illustrates a sectional view of a DIMM connector and DIMM PCB portion, consistent with one embodiment of the present disclosure.

FIG. 4 illustrates a sectional view 400 of a DIMM connector and DIMM PCB portion, consistent with one embodiment of the present disclosure. Sectional view 400 corresponds to section B-B' of FIG. 1. Sectional view 400 is configured to illustrate capacitive structures configured to provide mutual capacitance when the capacitive structures are included in a DIMM PCB, e.g., DIMM PCB 108 of FIG. 1. Sectional view 400 includes a plurality of DIMM connector contact pins, a corresponding plurality of DIMM PCB contacts and three capacitive structures configured to provide three mutual capacitances, as described herein. Sectional view 400 has been simplified for ease of illustration and ease of description.

Sectional view 400 includes a system 401, a plurality of DIMM connector pins, e.g., DIMM connector pins 402a, 402b, 402c, 402d, 402e, 402f and the plurality of DIMM PCB contacts, e.g., DIMM PCB contacts 404a, 404b, 404c, 404d, 404e, 404f. For example, DIMM connector pins 402a, 402c and 402d may be signal pins and DIMM connector pins 402b, 402e and 402f may be ground pins. Thus, sectional view 400 illustrates a signal pin to ground pin ratio of 1:1. Sectional view 400 further includes three capacitive structures 410a, 410b, 410c.

The DIMM PCB contacts 404a, 404b, ..., 404f and the three capacitive structures 410a, 410b, 410c may be included in a DIMM PCB, e.g., DIMM PCB 108 of FIG. 1. For example, the capacitive structures may be included in a ground recess region positioned behind the DIMM PCB contacts and as described herein. In other words, the DIMM PCB contacts are positioned between the DIMM connector pins and the capacitive structures. The capacitive structures have been drawn on top in FIG. 4 to clearly illustrate their positions relative to the DIMM connector pins and the DIMM PCB contacts.

Each capacitive structure 410a, 410b, 410c includes a respective via 412a, 412b, 412c coupled to a respective conductive trace 414a, 414b, 414c coupled to a respective plate 416a, 416b, 416c. Each via may be coupled to a respective first DIMM PCB contact and each plate 416a, 416b, 416c is positioned relative to a respective second DIMM PCB contact and is configured to overlap at least a portion of the respective second DIMM PCB contact. For example, via 412a is coupled to DIMM PCB contact 404a and plate 416a is positioned relative to DIMM PCB contact 404c. Continuing with this example, trace 414a is configured to span DIMM PCB contact 404b in a DIMM PCB layer that is not electrically coupled to DIMM PCB contact 404b. For example, trace 414a and plate 416a may be included in a ground plane recess. For example, DIMM PCB contact 404b may be coupled to ground.

At least a portion of each DIMM PCB contact, e.g., at least a portion of DIMM PCB contact 404c, may be included in a mutual capacitor and/or maybe coupled to a capacitive structure, e.g., capacitive structure 410b. For example, a portion of DIMM PCB contact 404c may correspond to a first plate of a parallel plate capacitor that also includes a second plate 416a of capacitive structure 410a. Continuing with this example, DIMM PCB contact 404c is also coupled to via 412b of capacitive structure 410b. Thus, DIMM PCB contact 404c and DIMM connector pin 402c may be provided component mutual capacitances related to DIMM connector pin 402a and DIMM connector pin 402d. An amount of each component mutual capacitance is related to a size of plate 416a and a size of plate 416b, as described herein.

Thus, a mutual capacitance that may include one or more component mutual capacitances may be coupled to a DIMM PCB contact, and thus, to a corresponding DIMM connector pin. The mutual capacitances are configured to mitigate far end crosstalk that may be related to mutual inductance between a target signal pin, i.e., DIMM connector pin, and one or more other signal pins. For example, capacitive structures 410a, 410b, 410c are configured to provide mitigation of crosstalk on a victim 404c due to two adjacent aggressors 404a and 404d. Mitigation of crosstalk due to more than two aggressors may be similarly implemented by designing the corresponding capacitive structures, e.g., between contact 404c and contact 404g.

FIG. 5 illustrates a sectional view 500 of a DIMM connector portion and a plurality of DIMM PCB contacts, consistent with one embodiment of the present disclosure. Sectional view 500 corresponds to section B-B' of FIG. 1. Sectional view 500 is configured to illustrate capacitive structures configured to provide mutual capacitance when the capacitive structures are included in a DIMM connector, e.g., DIMM connector 106 of FIG. 1. Sectional view 500 includes a DIMM PCB portion 501, a plurality of DIMM connector pins 502a, 502b, 502c and the plurality of DIMM PCB contacts 504a, 504b, 504c. Sectional view 500 further includes a plurality of conductive features 510a, 510b, 510c, 510d. At least some of the conductive features may be included in a capacitive structure.

In this embodiment, the conductive features 510a, 510b, 510c, 510d and thus the corresponding capacitive structure(s) are coupled to DIMM connector pins. For example, a first conductive feature 510a is coupled to a first DIMM connector pin 502a. A second conductive feature 510b is coupled to a second DIMM connector pin 502b. A third conductive feature 510c is coupled to the second DIMM connector pin 502b and is opposed to the second conductive feature 510b. A fourth conductive feature 510d is coupled to a third DIMM connector pin 502c.

For example, the conductive features 510a, 510b, 510c, 510d may be generally rectangular shaped and may be formed of a conductive material, as described herein. A long axis of each rectangular feature 510a, 510b, 510c, 510d is generally parallel to a long axis of a corresponding DIMM connector pin 502a, 502b, 502c. The first rectangular feature 510a is adjacent and may be generally aligned with the second rectangular feature 510b. The first rectangular feature 510a and the second rectangular feature 510b may be included in a first capacitive structure 514a. The third rectangular feature 510c is adjacent and may be generally aligned with the fourth rectangular feature 510d. The third rectangular feature 510c in the fourth rectangular feature 510d may be included in a second capacitive structure 514b.

Adjacent rectangular features, e.g., rectangular features 510c and 510d, may be separated by a distance, d. A region between adjacent rectangular features may contain a dielectric material. The capacitive structures 514a, 514b, including pairs of adjacent rectangular features separated by a dielectric material, may be configured to provide a mutual capacitance to a DIMM connector signal pin, e.g., the second DIMM connector signal pin 502b. The adjacent rectangular features may correspond to parallel plates that are separated by a dielectric material of thickness, d. Thus, the adjacent rectangular features and dielectric material may correspond to a mutual capacitor.

The plurality of rectangular features 510a, 510b, 510c, 510d may be manufactured by, for example, a press fit process. The plurality of rectangular features may be further formed, e.g., bent, to a selected geometry prior to insertion into the DIMM connector housing. For example, the selected geometry may correspond to a shape of an existing DIMM connector contact.

FIG. 6 illustrates a sectional view 600 of another DIMM connector portion and a plurality of DIMM PCB contacts, consistent with one embodiment of the present disclosure. Sectional view 600 corresponds to section B-B' of FIG. 1. Sectional view 600 is configured to illustrate capacitive structures configured to provide mutual capacitance when the capacitive structures are included in a DIMM connector, e.g., DIMM connector 106 of FIG. 1. Sectional view 600 includes a DIMM PCB portion 601, a plurality of DIMM connector pins 602a, 602b, 602c and the plurality of DIMM PCB contacts 604a, 604b, 604c. Sectional view 600 further includes a plurality of conductive features 610a, 610b, 610c, 610d.

In this embodiment, the rectangular features are coupled to DIMM connector pins. Each of the plurality of conductive features may be generally rectangular. For example, a first rectangular feature 610a is coupled to a first DIMM connector pin 602a. A second rectangular feature 610b is coupled to a second DIMM connector pin 602b. A third rectangular feature 610c is coupled to the first DIMM connector pin 602a on a same side as the first rectangular feature 610a. A fourth rectangular feature 610d is coupled to the second DIMM connector pin 602b on a same side as the second rectangular feature 610b. The first and third rectangular features 610a, 610c are interleaved with the second and fourth rectangular features 610b, 610d. A long axis of the rectangular features is generally perpendicular to a long axis of the DIMM connector pins.

The interleaved rectangular features 610a, 610b, 610c, 610d may correspond to a capacitive structure. The interleaved rectangular features 610a, 610b, 610c, 610d may be configured to provide a mutual capacitance between the first and second DIMM connector pins 602a, 602b. An amount of the mutual capacitance is related to an area of interleaving (i.e., overlap) of adjacent pairs of rectangular features. Pairs of adjacent rectangular features, e.g., rectangular features 610a and 610b and rectangular features 610b and 610c, may each be separated by a distance, d. A region between adjacent rectangular features may contain a dielectric material. Each pair of adjacent rectangular features, e.g., rectangular features 610a and 610b and 610b and 610c, may correspond to and/or be included in a capacitive structure. Each pair of adjacent rectangular features may be configured to provide a mutual capacitance. In other words, the pairs of adjacent rectangular features may correspond to a component mutual capacitor, as described herein.

The plurality of rectangular features 610a, 610b, 610c, 610d may be manufactured by, for example, a press fit process. The plurality of rectangular features may be further formed, e.g., bent, to a selected geometry prior to insertion into the DIMM connector housing. For example, the selected geometry may correspond to a shape of an existing DIMM connector contact.

Thus, consistent with the teachings of the present disclosure, an apparatus, method and/or system are configured to provide, e.g., increase, a mutual capacitance between DDR memory channels in, at or near the DIMM connector. The mutual capacitance may be provided by at least one capacitive structure, as described herein. The provided mutual capacitance is configured to mitigate mutual inductance and, thus, to reduce far end crosstalk between the DDR memory channels. In one embodiment, mutual capacitance may be increased by adding a capacitive structure within a DIMM PCB. In another embodiment, mutual capacitance may be increased by adding a capacitive structure within the DIMM connector. In another embodiment, mutual capacitance may be increased by adding a capacitive structure to the system PCB that includes a processor. In another embodiment, mutual capacitance may be increased by adding discrete capacitors coupled between DDR memory channels at or near the DIMM connector.

The mutual capacitance may be determined based, at least in part, on measured and/or modeled mutual inductance between signal channels. In one example, an allowable DDR data rate may be increased for a same pin configuration of a DIMM connector. In another example, an allowable DDR data rate may be maintained and one or more ground pins may be eliminated and/or a signal pin separation may be decreased and, thus a footprint of the DIMM connector may be decreased.

EXAMPLES

Examples of the present disclosure include subject material such as a method, means for performing acts of the method, a device, or of an apparatus or system related to memory channel crosstalk reduction, as discussed below.

Example 1

According to this example, there is provided an apparatus. The apparatus includes a dual in-line memory module (DIMM). The DIMM includes at least one memory module integrated circuit (IC), a DIMM printed circuit board (PCB), a plurality of DIMM PCB contacts, and a capacitive structure. Each DIMM PCB contact is to couple the memory module IC to a respective DIMM connector pin. The capacitive structure provides a mutual capacitance between a first DIMM connector signal pin and a second DIMM connector signal pin.

Example 2

This example includes the elements of example 1, wherein the plurality of DIMM PCB contacts includes a first DIMM PCB contact and a second DIMM PCB contact. The first DIMM PCB contact is to couple to the first DIMM connector signal pin. The second DIMM PCB contact is to couple to a second DIMM connector signal pin. The capacitive structure includes a via coupled to the first DIMM PCB contact, a trace coupled to the via, and a plate coupled to the trace. The plate is positioned relative to the second DIMM PCB contact and separated from the second DIMM PCB contact by a dielectric material. The plate, at least a portion of the second DIMM PCB contact, and the dielectric material corresponds to a mutual capacitor.

Example 3

This example includes the elements of example 2, wherein the plate has an area, A, and is separated from the second DIMM PCB contact by a distance, d.

Example 4

This example includes the elements of example 3, wherein the area, A, is selected to achieve a target mutual capacitance between the first DIMM PCB contact and the second DIMM PCB contact, the target mutual capacitance to reduce a far end crosstalk produced by at least one DIMM connector signal pin.

Example 5

This example includes the elements of any one of examples 1 or 2, wherein the DIMM PCB includes a plurality of capacitive structures to provide a plurality of mutual capacitances between the first DIMM connector signal pin and a plurality of other DIMM connector signal pins.

Example 6

This example includes the elements of any one of examples 1 or 2, wherein at least a portion of the capacitive structure is included in a ground plane recess in the DIMM PCB.

Example 7

This example includes the elements of example 4, wherein the target mutual capacitance is on the order of 1 picofarad (pF).

Example 8

This example includes the elements of example 3, wherein the area, A, is in the range of 100 um$^2$ (micrometers$^2$) to 1 mm$^2$ (millimeters$^2$) and the distance, d, is in the range of 5 um to 200 um.

Example 9

According to this example, there is provided a dual in-line memory module (DIMM) connector. The DIMM connector includes a first DIMM connector signal pin, a second DIMM connector signal pin, and a first capacitive structure. The first capacitive structure is to provide a mutual capacitance between the first DIMM connector signal pin and the second DIMM connector signal pin. The mutual capacitance is to reduce a far end crosstalk produced by at least one DIMM connector signal pin.

Example 10

This example includes the elements of example 9, wherein the first capacitive structure includes a plurality of rectangular features. A first rectangular feature is coupled to the first DIMM connector signal pin and a second rectangular feature is coupled to the second DIMM connector signal pin. The rectangular features are positioned relative to each other.

Example 11

This example includes the elements of example 10, wherein a long axis of each rectangular feature is generally parallel to a long axis of a respective DIMM connector signal pin.

Example 12

This example includes the elements of example 10, wherein a long axis of each rectangular feature is generally perpendicular to a long axis of a respective DIMM connector signal pin.

Example 13

This example includes the elements of example 10, and further includes a third rectangular feature coupled to the first DIMM connector signal pin and a fourth rectangular feature coupled to the second DIMM connector signal pin.

The first and third rectangular features are interleaved with the second and fourth rectangular features.

Example 14

This example includes the elements of any one of examples 9 or 10, wherein a signal pin to ground pin ratio is greater than one to one.

Example 15

This example includes the elements of example 10, wherein the first rectangular feature is separated from the second rectangular feature by a distance, d, and a region between the first rectangular feature and the second rectangular feature includes a dielectric material.

Example 16

This example includes the elements of any one of examples 9 or 10, and further includes a third DIMM connector signal pin adjacent the second DIMM connector signal pin and a second capacitive structure to provide a mutual capacitance between the second DIMM signal pin and the third DIMM signal pin.

Example 17

According to this example, there is provided a system. The system includes a processor, a DIMM connector, a dual in-line memory module (DIMM), and a capacitive structure. The capacitive structure is to provide a mutual capacitance between a first DIMM connector signal pin and a second DIMM connector signal pin. The DIMM includes at least one memory module integrated circuit (IC), a DIMM printed circuit board (PCB), and a plurality of DIMM PCB contacts. Each DIMM PCB contact is to couple the memory module IC to a respective DIMM connector pin.

Example 18

This example includes the elements of example 17, wherein the plurality of DIMM PCB contacts includes a first DIMM PCB contact to couple to the first DIMM connector signal pin and a second DIMM PCB contact to couple to the second DIMM connector signal pin. The capacitive structure includes a via coupled to the first DIMM PCB contact, a trace coupled to the via, and a plate coupled to the trace. The plate is positioned relative to the second DIMM PCB contact and separated from the second DIMM PCB contact by a dielectric material. The plate, at least a portion of the second DIMM PCB contact, and the dielectric material correspond to a mutual capacitor.

Example 19

This example includes the elements of example 18, wherein the plate has an area, A, and is separated from the second DIMM PCB contact by a distance, d.

Example 20

This example includes the elements of example 19, wherein the area, A, is selected to achieve a target mutual capacitance between the first DIMM PCB contact and the second DIMM PCB contact. The target mutual capacitance is to reduce a far end crosstalk produced by at least one DIMM connector signal pin.

Example 21

This example includes the elements of any one of examples 17 or 18, wherein the DIMM PCB includes a plurality of capacitive structures to provide a plurality of mutual capacitances between the first DIMM connector signal pin and a plurality of other DIMM connector signal pins.

Example 22

This example includes the elements of any one of examples 17 or 18, wherein at least a portion of the capacitive structure is included in a ground plane recess in the DIMM PCB.

Example 23

This example includes the elements of example 20, wherein the target mutual capacitance is on the order of 1 picofarad (pF).

Example 24

This example includes the elements of example 17, wherein the DIMM connector includes the capacitive structure.

Example 25

This example includes the elements of example 24, wherein the DIMM connector includes a first DIMM connector signal pin, a second DIMM connector signal pin, and a first capacitive structure. The first capacitive structure is to provide a mutual capacitance between the first DIMM connector signal pin and the second DIMM connector signal pin. The mutual capacitance is to reduce a far end crosstalk produced by at least one DIMM connector signal pin.

Example 26

This example includes the elements of example 25, wherein the first capacitive structure includes a plurality of rectangular features. A first rectangular feature is coupled to the first DIMM connector signal pin and a second rectangular feature is coupled to the second DIMM connector signal pin. The rectangular features are positioned relative to each other.

Example 27

This example includes the elements of example 26, wherein a long axis of each rectangular feature is generally parallel to a long axis of a respective DIMM connector signal pin.

Example 28

This example includes the elements of example 26, wherein a long axis of each rectangular feature is generally perpendicular to a long axis of a respective DIMM connector signal pin.

Example 29

This example includes the elements of example 26, wherein the DIMM connector further includes a third rectangular feature coupled to the first DIMM connector signal pin and a fourth rectangular feature coupled to the second DIMM connector signal pin. The first and third rectangular features are interleaved with the second and fourth rectangular features.

Example 30

This example includes the elements of example 25, wherein a signal pin to ground pin ratio is greater than one to one.

Example 31

This example includes the elements of example 26, wherein the first rectangular feature is separated from the second rectangular feature by a distance, d, and a region between the first rectangular feature and the second rectangular feature includes a dielectric material.

Example 32

This example includes the elements of example 25, and further includes a third DIMM connector signal pin adjacent the second DIMM connector signal pin and a second capacitive structure to provide a mutual capacitance between the second DIMM signal pin and the third DIMM signal pin.

Example 33

This example includes the elements of example 17, wherein the capacitive structure is a discrete capacitor.

Example 34

This example includes the elements of example 17, wherein the capacitive structure is coupled to a DIMM connector to system PCB pin.

Example 35

This example includes the elements of example 17, and further includes a system PCB, the capacitive structure included in or on the system PCB.

Example 36

This example includes the elements of example 33, wherein the discrete capacitor is coupled between the first DIMM connector signal pin and the second DIMM connector signal pin.

Example 37

This example includes the elements of example 35, wherein the capacitive structure is coupled between signal traces in the system PCB, at or near the DIMM connector.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An apparatus comprising:
    a dual in-line memory module (DIMM) comprising:
    a memory module integrated circuit (IC);
    a DIMM printed circuit board (PCB);
    a plurality of DIMM PCB contacts; and
    a capacitive structure to provide a mutual capacitance between a first DIMM connector signal pin and a second DIMM connector signal pin;
    wherein:
    the plurality of DIMM PCB contacts comprises a first DIMM PCB contact coupled to the first DIMM connector signal pin, a second DIMM PCB contact coupled to ground, and a third DIMM PCB contact coupled to the second DIMM connector signal pin;
    the second DIMM PCB contact is between the first and third DIMM PCB contacts;
    the capacitive structure comprises a via coupled to the first DIMM PCB contact, a trace coupled to the via, and a plate coupled to the trace, the plate positioned relative to the third DIMM PCB contact and separated from the third DIMM PCB contact by a dielectric material, wherein the trace spans the second DIMM PCB contact; and
    at least one of the trace and the plate are included in a layer of the DIMM PCB that is not electrically coupled to the second DIMM PCB contact.

2. The apparatus of claim 1, wherein:
    the plate, at least a portion of the second DIMM PCB contact and the dielectric material correspond to a mutual capacitor; and
    the layer of the DIMM PCB that is not electrically coupled to the second DIMM PCB contact is a ground plane recess of said DIMM PCB.

3. The apparatus of claim 1, wherein the plate has an area, A, and is separated from the third DIMM PCB contact by a distance, d.

4. The apparatus of claim 3, wherein the area, A, is selected to achieve a target mutual capacitance between the first DIMM PCB contact and the third DIMM PCB contact, the target mutual capacitance to reduce a far end crosstalk produced by at least one DIMM connector signal pin.

5. The apparatus of claim 1, wherein the DIMM PCB comprises a plurality of capacitive structures to provide a plurality of mutual capacitances between the first DIMM connector signal pin and a plurality of other DIMM connector signal pins.

6. The apparatus of claim 1, wherein the layer of the DIMM PCB that is not electrically coupled to the second DIMM PCB contact is a ground plane recess of said DIMM PCB.

7. The apparatus of claim 4, wherein the target mutual capacitance is about 1 picofarad (pF).

8. The apparatus of claim 1, further comprising a processor; and
    a DIMM connector.

9. The apparatus of claim 8, wherein:
the plate, at least a portion of the second DIMM PCB contact and the dielectric material corresponding to a mutual capacitor; and
the layer of the DIMM PCB that is not electrically coupled to the second DIMM PCB contact is a ground plane recess of said DIMM PCB.

10. The apparatus of claim 8, wherein the plate has an area, A, and is separated from the third DIMM PCB contact by a distance, d.

11. The apparatus of claim 10, wherein the area, A, is selected to achieve a target mutual capacitance between the first DIMM PCB contact and the third DIMM PCB contact, the target mutual capacitance to reduce a far end crosstalk produced by at least one DIMM connector signal pin.

12. The apparatus of claim 8, wherein the DIMM PCB comprises a plurality of capacitive structures to provide a plurality of mutual capacitances between the first DIMM connector signal pin and a plurality of other DIMM connector signal pins.

13. The apparatus of claim 8, wherein the layer of the DIMM PCB that is not electrically coupled to the second DIMM PCB contact is a ground plane recess of said DIMM PCB.

14. The apparatus of claim 11, wherein the target mutual capacitance is about 1 picofarad (pF).

\* \* \* \* \*